(12) United States Patent
Zhu et al.

(10) Patent No.: US 11,955,771 B2
(45) Date of Patent: Apr. 9, 2024

(54) CONTROL DEVICE AND METHOD FOR LASER DEVICE AND LASER MEASUREMENT DEVICE

(71) Applicant: NORTHWEST INSTRUMENT INC., Dover, NJ (US)

(72) Inventors: Chao Zhu, Shanghai (CN); Xin Shi, Shanghai (CN); David Xing, Dover, NJ (US)

(73) Assignee: NORTHWEST INSTRUMENT INC.

( * ) Notice: Subject to any disclaimer, the term of this patent is extended or adjusted under 35 U.S.C. 154(b) by 0 days.

(21) Appl. No.: 18/148,758

(22) Filed: Dec. 30, 2022

(65) Prior Publication Data

US 2023/0155350 A1 May 18, 2023

Related U.S. Application Data

(63) Continuation of application No. PCT/CN2021/104703, filed on Jul. 6, 2021.

(30) Foreign Application Priority Data

Dec. 24, 2020 (CN) .......................... 202011545557.5

(51) Int. Cl.
*H01S 5/068* (2006.01)
*H01S 5/0683* (2006.01)

(52) U.S. Cl.
CPC ...... *H01S 5/06804* (2013.01); *H01S 5/06808* (2013.01); *H01S 5/06835* (2013.01)

(58) Field of Classification Search
CPC ............. H01S 5/06808; H01S 5/06804; H01S 5/0625; H01S 5/068

(Continued)

(56) References Cited

U.S. PATENT DOCUMENTS

| 2004/0095112 | A1* | 5/2004 | Kernahan | H02M 1/0845 |
| | | | | 323/282 |
| 2004/0264539 | A1* | 12/2004 | Narayan | H04B 10/572 |
| | | | | 372/102 |
| 2006/0239316 | A1 | 10/2006 | Kim et al. | |

FOREIGN PATENT DOCUMENTS

| CN | 103208736 A | 7/2013 |
| CN | 107664496 A | 2/2018 |

(Continued)

OTHER PUBLICATIONS

The World Intellectual Property Organization (WIPO) International Search Report for PCT/CN2021/104703 dated Sep. 26, 2021 5 Pages (including translation).

*Primary Examiner* — Tuan N Nguyen
(74) *Attorney, Agent, or Firm* — ANOVA LAW GROUP, PLLC

(57) ABSTRACT

A control device for controlling a temperature of a laser device includes a pulse width modulation (PWM) signal generator, a temperature acquisition circuit, a voltage comparator, and a logic circuit. The a pulse width modulation (PWM) signal generator configured to generate a PWM signal; a temperature acquisition circuit configured to acquire a temperature of the laser device and convert the temperature into a measurement voltage; a voltage comparator configured to compare the acquired measurement voltage associated with the temperature of the laser device with a temperature threshold voltage and output a comparison result signal; and a logic circuit configured to generate a drive signal based on the PWM signal and the comparison result signal to drive the laser device.

17 Claims, 4 Drawing Sheets

(58) Field of Classification Search
USPC .................................................... 372/38.02
See application file for complete search history.

(56) References Cited

FOREIGN PATENT DOCUMENTS

| | | | | |
|---|---|---|---|---|
| CN | 110340516 A | | 10/2019 | |
| CN | 209897312 U | * | 1/2020 | ............ Y02B 20/30 |
| CN | 209897312 U | | 1/2020 | |
| CN | 112731989 A | | 4/2021 | |
| CN | 213659274 U | | 7/2021 | |

* cited by examiner

CONTROL DEVICE AND METHOD FOR LASER DEVICE AND LASER MEASUREMENT DEVICE

CROSS-REFERENCES TO RELATED APPLICATIONS

The present application is continuation of International Application No. PCT/CN2021/104703, filed on Jul. 6, 2021, which claims the priority of Chinese Patent Application No. 202011545557.5, filed on Dec. 24, 2020, the entire contents of both of which are incorporated herein by reference.

TECHNICAL FIELD

The present disclosure relates to the field of laser measurement and, more particularly, to a control device for a laser device, a control method for the laser device, and a laser measurement device including the above control device.

TECHNICAL BACKGROUND

Various laser measurement tools are widely used in industries such as construction. However, the laser device used by the laser measurement tool to generate laser inevitably generates heat during operation, which leads to continuous increase of the temperature of the laser device and the surrounding devices. On one hand, the aging degree of the laser device and other surrounding devices thereof may be accelerated and the service life thereof may be reduced. On the other hand, the measurement accuracy of such laser measurement tools may also be recured due to factors such as temperature drift.

SUMMARY

In view of the deep understanding of the problems discussed in the background technology, the present disclosure provides a control device and a corresponding control method for controlling the temperature of the laser device by using a logic circuit to change the driving power of the driving signal.

The first aspect of the present disclosure provides a control device for controlling the temperature of a laser device, where the control device includes: a pulse width modulation (PWM) signal generator, where the PWM signal generator is configured to generate a PWM signal; a temperature acquisition circuit, where the temperature acquisition circuit is configured to acquire a temperature of the laser device and convert the temperature into a measurement voltage; a voltage comparator, where the voltage comparator is configured to compare the measurement voltage associated with the temperature of the laser device with a temperature threshold voltage and output a comparison result signal; and a logic circuit, where the logic circuit is configured to generate a drive signal based on the PWM signal and the comparison result signal to drive the laser device.

The control device according to the present disclosure can realize, by using simple components such as a voltage comparator and a logic circuit, temperature comparison and generate a driving signal for driving the laser device according to the PWM signal and the comparison result signal when the temperature exceeds a predetermined threshold. As such, the power of the signal driving the laser device can be reduced. In turn, the temperature of the laser device can be controlled, leading to a longer lifetime and improved accuracy of the laser device at a lower cost and higher reliability.

In an embodiment according to the present disclosure, a duty ratio of the PWM signal is not less than 5:5. For example, the duty ratio of the PWM signal is not less than 7:3. In one embodiment according to the present disclosure, the logic circuit includes an Exclusive-OR (XOR) gate circuit. For example, in an embodiment according to the present disclosure, the XOR gate circuit is configured to invert, when the acquired measurement voltage associated with the temperature of the laser device is higher than the temperature threshold voltage, the PWM signal to reduce the power to drive the laser device.

In an embodiment according to the present disclosure, the temperature acquisition circuit includes a temperature sensor. The temperature sensor is configured to acquire and convert the temperature of the laser device into a measurement voltage.

In an embodiment according to the present disclosure, the laser device includes at least one laser diode.

A second aspect of the present disclosure provides a laser measurement device, where the laser measurement device includes: a laser device, where the laser device is configured to emit laser for measurement; and a control device for controlling the temperature of the laser device according to the first aspect of the present disclosure.

In one embodiment according to the present disclosure, the laser device includes at least one laser diode.

In an embodiment according to the present disclosure, the laser measurement device includes a laser leveling device, a laser line projection device and/or a laser distance meter.

A third aspect of the present disclosure provides a control method for controlling the temperature of a laser device, where the control method includes: generating a PWM signal; acquiring and converting a temperature of the laser device into a measurement voltage; comparing, by a voltage comparator, the acquired measurement voltage associated with the temperature of the laser device with a temperature threshold voltage, and outputting a comparison result signal; and generating, by a logic circuit, a drive signal based on the PWM signal and the comparison result signal to drive the laser device.

The control device according to the present disclosure can realize, by using simple components such as a voltage comparator and a logic circuit, temperature comparison and generate a driving signal for driving the laser device according to the PWM signal and the comparison result signal when the temperature exceeds a predetermined threshold. As such, the power of the signal driving the laser device can be reduced. In turn, the temperature of the laser device can be controlled, leading to a longer lifetime and improved accuracy of the laser device at a lower cost and higher reliability.

Optionally, in an embodiment according to the present disclosure, a duty ratio of the PWM signal is not less than 5:5. For example, the duty ratio of the PWM signal is not less than 7:3. In one embodiment according to the present disclosure, the logic circuit includes an XOR gate circuit. In an embodiment according to the present disclosure, the control method further includes inverting, by the XOR gate circuit when the acquired measurement voltage associated with the temperature of the laser device is higher than the temperature threshold voltage, the PWM signal to reduce the power to drive the laser device.

Optionally, in an embodiment according to the present disclosure, the temperature acquisition circuit includes a temperature sensor, where acquiring the temperature of the laser device further includes acquiring the temperature of the laser device by the temperature sensor.

The control device according to the present disclosure can realize, by using simple components such as a voltage comparator and a logic circuit, temperature comparison and generate a driving signal for driving the laser device according to the PWM signal and the comparison result signal when the temperature exceeds a predetermined threshold. As such, the power of the signal driving the laser device can be reduced. In turn, the temperature of the laser device can be controlled, leading to a longer lifetime and improved accuracy of the laser device at a lower cost and higher reliability.

DESCRIPTION OF THE DRAWINGS

Embodiments are shown and explained with reference to the accompanying drawings. The drawings are for describing the basic principles, thus showing only the aspects necessary to understand the basic principles. The drawings are not to scale. In the drawings, the same reference numbers refer to similar features.

Other features, characteristics, advantages and benefits of the present disclosure will become more apparent from the following detailed description taken in conjunction with the accompanying drawings.

DETAILED DESCRIPTION OF THE EMBODIMENTS

In the following detailed description of the preferred embodiments, reference will be made to the accompanying drawings which form a part of this disclosure. The accompanying drawings show, by showing examples, specific embodiments in which the present disclosure can be practiced. The exemplary embodiments are not intended to be exhaustive of all embodiments in accordance with the present disclosure. It is to be understood that other embodiments may be utilized and structural or logical modifications may be made without departing from the scope of the present disclosure. Therefore, the following detailed description is not limiting, and the scope of the present disclosure is defined by the appended claims.

Figure 1:
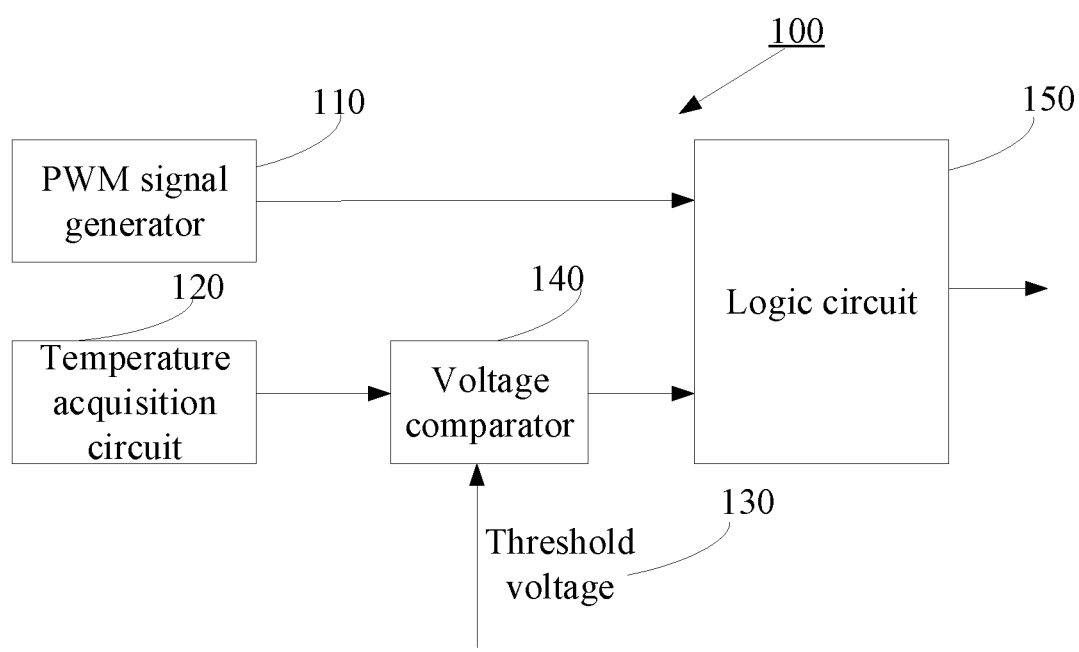
FIG. 1 shows a schematic structural diagram of a control device 100 for controlling the temperature of the laser device according to an embodiment of the present disclosure.

In order to solve the technical problems such as the low lifetime of the laser device, the present application provides a control device for controlling the temperature of the laser device. FIG. 1 shows a schematic structural diagram of a control device 100 for controlling the temperature of the laser device according to an embodiment of the present disclosure. As shown in FIG. 1, the control device 100 for controlling the temperature of the laser device provided according to the present disclosure includes the following parts:

a pulse width modulation (PWM) signal generator 110, where the PWM signal generator 110 is configured to generate a PWM signal, the PWM signal being to be input into the subsequent logic circuit 150;

a temperature acquisition circuit 120, where the temperature acquisition circuit 120 is configured to acquire the temperature of the laser device (not shown in FIG. 1) and convert it into a measurement voltage. Therefore, in actual installation, the temperature acquisition circuit 120 may need to be provided close to the laser device, or directly in close contact with the laser device. Of course, those skilled in the art should understand that when, for example, non-contact temperature acquisition is adopted, e.g., when the infrared temperature acquisition method is used, the temperature acquisition circuit 120 can also be arranged far away from the laser device;

a voltage comparator 140, where the voltage comparator 140 is configured to compare the acquired measurement voltage associated with the temperature of the laser device with a temperature threshold voltage and to output a comparison result signal. Here, the temperature threshold voltage, e.g., the threshold voltage 130 shown in the example of FIG. 1, is input, for example, through an input terminal of the voltage comparator 140; and a logic circuit 150, where the logic circuit 150 is configured to generate, based on the PWM signal (generated by the PWM signal generator 110) and the comparison result signal (the comparison result signal output by the voltage comparator 140), a drive signal to drive the laser device.

The control device according to the present disclosure can realize, by using simple components such as a voltage comparator 140 and a logic circuit 150, temperature comparison and generate a driving signal for driving the laser device according to the PWM signal (generated by the PWM signal generator 110) and the comparison result signal (the comparison result signal output by the voltage comparator 140) when the temperature exceeds a predetermined threshold. As such, the power of the signal driving the laser device can be reduced. In turn, the temperature of the laser device can be controlled, leading to a longer lifetime and improved accuracy of the laser device at a lower cost and higher reliability.

In an embodiment according to the present disclosure, the temperature acquisition circuit 120 can be implemented as a temperature sensor. For example, the present embodiment adopts a thermistor, and the resistance of the thermistor is about 2.3K at 68 degrees. This embodiment employs a non-inverting voltage hysteresis comparator as the voltage comparator. The technical solution disclosed in the present disclosure uses a hysteresis voltage of about 300 mv, a high threshold limit Vh of 1.783 v, and a low threshold limit Vl of 1.476 v. When the temperature rises to 68 degrees, through voltage conversion, the temperature detection circuit generates a voltage greater than 1.783V, and the voltage comparator 140 outputs a high level, which is XORed with the PWM signal generated by the PWM generator 110, thereby reducing the working power of the laser device. The PWM generator 110 can use a single-chip microcomputer or a PWM generating circuit to generate a PWM square wave signal. The temperature acquisition circuit 120 can use an NTC resistor or a temperature detection chip to acquire the current temperature of the laser device. The voltage comparator 150 may use a single-limit comparator, a hysteresis comparator, and/or a window comparator to output the comparison result. The logic circuit 150 may use various gate circuits such as an Exclusive-OR gate circuit. The voltage comparator 140 compares the set voltage value with the voltage value sampled by the NTC, and performs XOR with the signal of the PWM generator 110, thereby reducing the operating power of the laser device.

In an embodiment according to the present disclosure, a duty ratio of the PWM signal generated by the PWM signal generator 110 is not less than 5:5. For example, the duty ratio of the PWM signal generated by the PWM signal generator 110 is not less than 7:3. In one embodiment according to the present disclosure, the logic circuit 150 includes an XOR gate circuit. In an embodiment according to the present disclosure, the XOR gate circuit is configured to invert, when the acquired measurement voltage associated with the temperature of the laser device is higher than the temperature threshold voltage, the PWM signal (generated by the PWM signal generator 110) to reduce the power to drive the laser device.

Optionally, in one embodiment according to the present disclosure, the temperature acquisition circuit 120 includes a temperature sensor, where the temperature sensor is configured to acquire and convert the temperature of the laser device into a measurement voltage. Optionally, in an embodiment according to the present disclosure, the laser device includes at least one laser diode.

Figure 2:
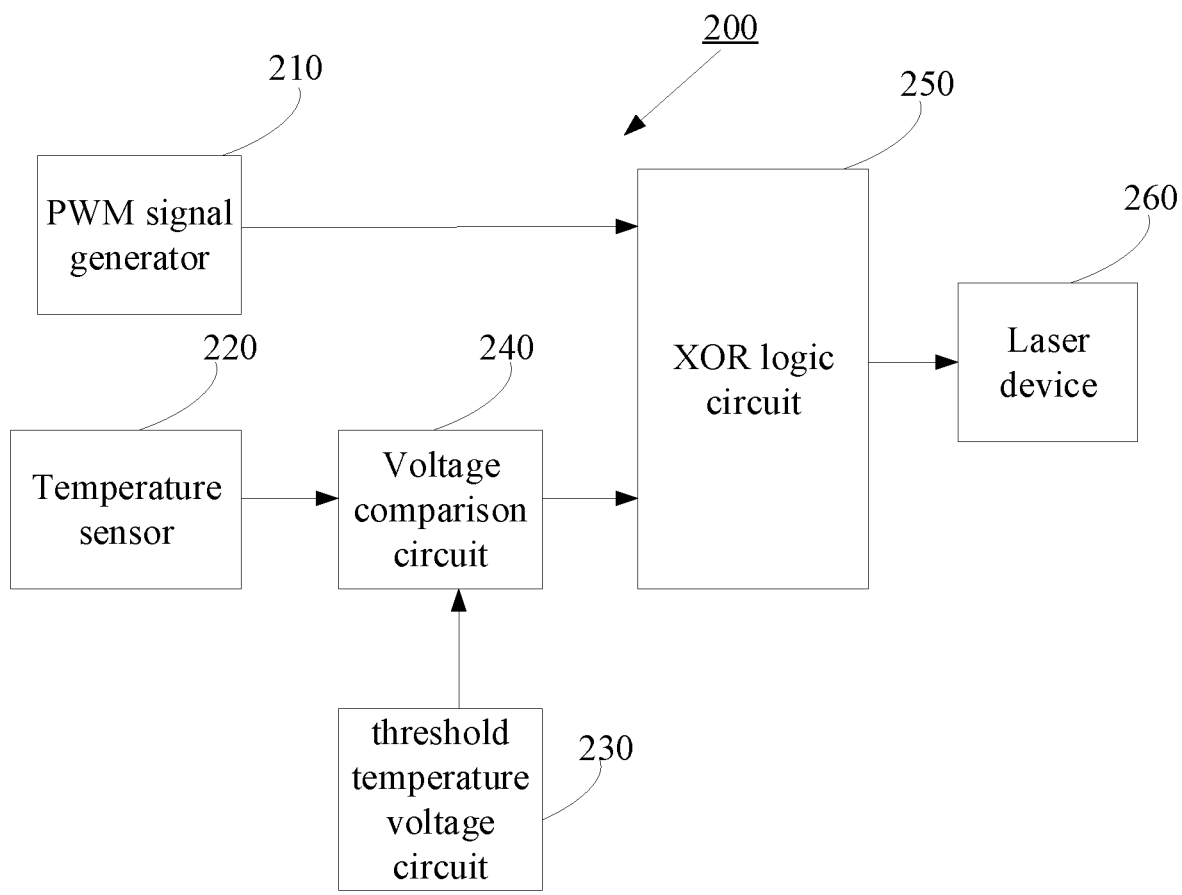
FIG. 2 shows a schematic structural diagram of a control device 200 for controlling the temperature of the laser device according to another embodiment of the present disclosure.

FIG. 2 shows a schematic structural diagram of a control device 200 for controlling the temperature of the laser device according to an embodiment of the present disclosure. As shown in FIG. 2, the control device 200 for controlling the temperature of the laser device proposed according to the present disclosure includes the following parts:

a PWM signal generator 210, where the PWM signal generator 210 is configured to generate a PWM signal, and the PWM signal is to be input into the following XOR gate circuit 250;

a temperature sensor 220, where the temperature sensor 220 is configured to acquire the temperature of the laser device 260 and convert it into a measurement voltage. Thus, it may be necessary to place the temperature sensor 220 close to, or directly in close contact with the laser device 260 in actual installations. Of course, those skilled in the art should understand that when, for example, non-contact temperature acquisition is adopted, e.g., when the infrared temperature acquisition is adopted, the temperature sensor 220 can also be arranged far away from the laser device 260;

a voltage comparison circuit 240, where the voltage comparison circuit 240 is configured to compare the acquired measurement voltage associated with the temperature of the laser device 260 with a temperature threshold voltage and to output a comparison result signal. Here, the temperature threshold voltage, e.g., the temperature threshold voltage output by the threshold temperature voltage circuit 230 as shown in the example in FIG. 2, is, for example, input through an input terminal of the voltage comparison circuit 240; and an XOR gate circuit 250, where the XOR gate circuit 250 is configured to generate, based on the PWM signal (generated by the PWM signal generator 210) and the comparison result signal (the comparison result signal output by the voltage comparator 240), a driving signal to drive the laser device 260.

The control device according to the present disclosure can realize, by using simple components such as a voltage comparison circuit 240 and a XOR logic circuit 250, temperature comparison and generate a driving signal for driving the laser device 260 according to the PWM signal (generated by the PWM signal generator 210) and the comparison result signal (the comparison result signal output by the voltage comparator 240) when the temperature exceeds a predetermined threshold. As such, the power of the signal driving the laser device 260 can be reduced. In turn, the temperature of the laser device 260 can be controlled, the working stability of the laser device 260 can be improved, leading to a longer lifetime and improved accuracy of the laser device 260 at a lower cost and higher reliability.

In an embodiment according to the present disclosure, the temperature sensor 220 can adopt, e.g., a thermistor, and the resistance of the thermistor is about 2.3K at 68 degrees. A non-inverting voltage hysteresis comparator is applied. The technical solution disclosed in the present disclosure uses a hysteresis voltage of about 300 mv, a threshold Vh of 1.783 v, and a threshold Vl of 1.476 v. When the temperature rises to 68 degrees, the temperature detection circuit generates a voltage greater than 1.783V, and the voltage comparison circuit 240 outputs a high level, which is XORed with the PWM signal generated by the PWM generator 210, thereby reducing the working power of the laser device. The PWM generator 210 may include a single-chip microcomputer or a PWM generating circuit to generate a PWM square wave signal, and the temperature acquisition circuit 220 can use an NTC resistor or a temperature detection chip to acquire the current temperature of the laser device. The voltage comparison circuit 240 may use a single-limit comparator, a hysteresis comparator, and/or a window comparator to output the comparison result. The XOR logic circuit 250 may use various gate circuits such as an XOR or other logic gate. The voltage comparison circuit 240 compares the set voltage value with the voltage value sampled by the NTC, and performs XOR with the signal of the PWM generator 210, thereby reducing the operating power of the laser device.

In an embodiment according to the present disclosure, the duty ratio of the PWM signal generated by the PWM signal generator 210 is not less than 5:5. For example, the duty ratio of the PWM signal generated by the PWM signal generator 210 is not less than 7:3. In one embodiment in accordance with the present disclosure, the XOR circuit 250 is configured to invert, when the acquired measurement voltage associated with the temperature of the laser device 260 is higher than the temperature threshold voltage, the PWM signal (generated by the PWM signal generator 210) to reduce the power for driving the laser device 260.

Optionally, in an embodiment according to the present disclosure, the temperature sensor 220 is configured to acquire the temperature of the laser device 260 and convert it into the measurement voltage. Optionally, in one embodiment according to the present disclosure, the laser device 260 includes at least one laser diode.

Figure 3:
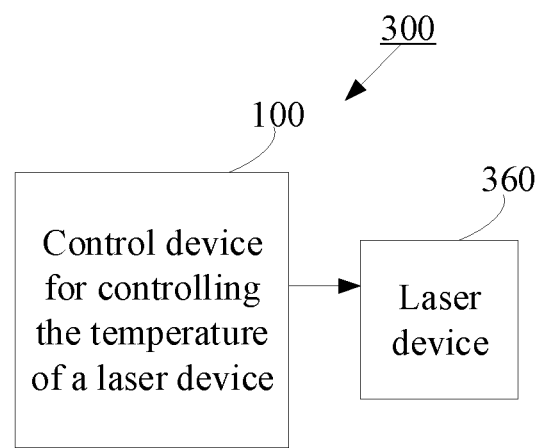
FIG. 3 shows a schematic structural diagram of a laser measurement device 300 including the control device shown in FIG. 1 or FIG. 2.

FIG. 3 shows a schematic structural diagram of a laser measurement device 300 including the control device shown in FIG. 1 or FIG. 2. As shown in FIG. 3, the laser measurement device 300 provided by the second aspect of the present disclosure includes a laser device 360, where the laser device 360 is configured to emit laser for measurement. The laser measurement device 300 provided in the second aspect further includes the control device 100 proposed according to the first aspect of the present disclosure for controlling the temperature of the laser device. In one embodiment in accordance with the present disclosure, the laser device 360 includes at least one laser diode. In an embodiment according to the present disclosure, the laser measurement device 300 may be any one of a laser leveling device, a laser line projection device, a laser spot projection device, and a laser distance meter. That is, the control device 100 for controlling the temperature of a laser device proposed according to the present disclosure can be applied to any measuring device having a laser device, and it can control the temperature of the laser device, thereby improving the service life of the laser device.

Figure 4:
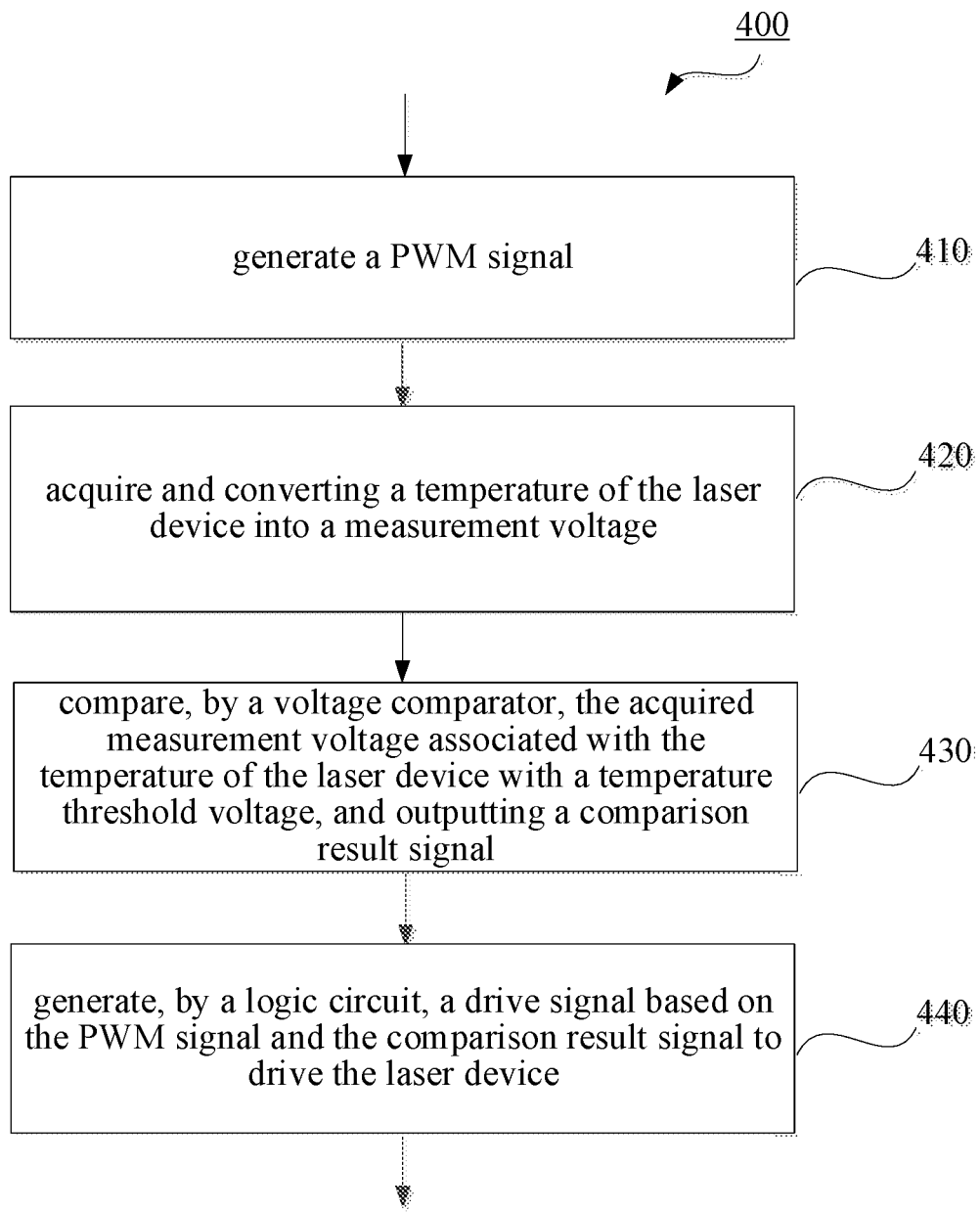
FIG. 4 shows a schematic flowchart of a control method 400 for controlling the temperature of the laser device according to an embodiment of the present disclosure.

FIG. 4 shows a schematic flowchart of a control method 400 for controlling the temperature of the laser device according to an embodiment of the present disclosure. As shown in FIG. 4, the control method 400 for controlling the temperature of a laser device provided by the third aspect of the present disclosure includes the following method steps:

Method step 410: generating a PWM signal;

Method step 420: acquiring the temperature of the laser device and converting it into a measurement voltage;

Method step 430: comparing, by a voltage comparator, the acquired measurement voltage associated with the temperature of the laser device with a temperature threshold voltage, and outputting a comparison result signal; and Method step 440: generating, by a logic circuit, a drive signal based on the PWM signal and the comparison result signal to drive the laser device. The control device according to the present disclosure can realize, by using simple components such as a voltage comparator and a logic circuit, temperature comparison and generate a driving signal for driving the laser device according to the PWM signal and the comparison result signal when the temperature exceeds a predetermined threshold. As such, the power of the signal driving the laser device can be reduced. In turn, the temperature of the laser device can be controlled, leading to a longer lifetime and improved accuracy of the laser device at a lower cost and higher reliability.

Optionally, in an embodiment according to the present disclosure, a duty ratio of the PWM signal is not less than 5:5. For example, the duty ratio of the PWM signal is not less than 7:3. In one embodiment according to the present disclosure, the logic circuit includes an XOR gate circuit. In an embodiment according to the present disclosure, the control method further includes inverting, by the XOR gate circuit when the acquired measurement voltage associated with the temperature of the laser device is higher than the temperature threshold voltage, the PWM signal to reduce the power to drive the laser device. Optionally, in an embodiment according to the present disclosure, the temperature acquisition circuit includes a temperature sensor, where acquiring the temperature of the laser device further includes acquiring the temperature of the laser device by the temperature sensor.

The control device according to the present disclosure can realize, by using simple components such as a voltage comparator and a logic circuit, temperature comparison and generate a driving signal for driving the laser device according to the PWM signal and the comparison result signal when the temperature exceeds a predetermined threshold. As such, the power of the signal driving the laser device can be reduced. In turn, the temperature of the laser device can be controlled, leading to a longer lifetime and improved accuracy of the laser device at a lower cost and higher reliability.

Although various exemplary embodiments of the present disclosure have been described, it would be obvious to those skilled in the art that various changes and modifications can be made without departing from the spirit and spirit of the present disclosure. One or some of the advantages of the present disclosure are realized within the scope of the present disclosure. Other components performing the same function may be substituted as appropriate to those skilled in the art. It should be understood that features explained herein with reference to a particular figure may be combined with features of other figures, even in those cases where this is not explicitly mentioned. Furthermore, the methods of the present disclosure may be implemented either in all software implementations using appropriate processor instructions or in hybrid implementations that utilize a combination of hardware logic and software logic to achieve the same results. Such modifications to the solution according to the present disclosure are intended to be covered by the appended claims.

What is claimed is:

1. A control device for controlling a temperature of a laser device, comprising:
   a pulse width modulation (PWM) signal generator configured to generate a PWM signal;
   a temperature acquisition circuit configured to acquire a temperature of the laser device and convert the temperature into a measurement voltage;
   a voltage comparator configured to compare the measurement voltage associated with the temperature of the laser device to a temperature threshold voltage and to output a comparison result signal; and
   a logic circuit configured to generate, based on the PWM signal and the comparison result signal, a drive signal to drive the laser device, wherein the logic circuit is further configured to invert the PWM signal to reduce a power for driving the laser device, when the measurement voltage associated with the temperature of the laser device is higher than the temperature threshold voltage.

2. The control device according to claim 1, wherein the duty ratio of the PWM signal is not less than 5:5.

3. The control device according to claim 1, wherein the logic circuit includes an exclusive-OR (XOR) gate circuit.

4. The control device according to claim 1, wherein the temperature acquisition circuit includes a temperature sensor configured to acquire and convert the temperature of the laser device into the measurement voltage.

5. The control device according to claim 1, wherein the laser device comprises at least one laser diode.

6. The control device of claim 1, wherein the logic circuit is further configured such that the comparison result signal is XORed with the PWM signal, thereby reducing the power of the laser device.

7. A laser measurement device, comprising:
   a laser device configured to emit laser for measurement; and
   a control device for controlling a temperature of the laser device, the control device includes:
      a pulse width modulation (PWM) signal generator configured to generate a PWM signal;
      a temperature acquisition circuit configured to acquire a temperature of the laser device and convert the temperature into a measurement voltage;
      a voltage comparator configured to compare the measurement voltage associated with the temperature of the laser device to a temperature threshold voltage and to output a comparison result signal; and
      a logic circuit configured to generate, based on the PWM signal and the comparison result signal, a drive signal to drive the laser device, wherein the logic circuit is further configured to invert the PWM signal to reduce a power for driving the laser device, when the measurement voltage associated with the temperature of the laser device is higher than the temperature threshold voltage.

8. The laser measurement device according to claim 7, wherein the duty ratio of the PWM signal is not less than 5:5.

9. The laser measurement device according to claim 7, wherein the logic circuit includes an exclusive-OR (XOR) gate circuit.

10. The laser measurement device according to claim 7, wherein the temperature acquisition circuit includes a temperature sensor configured to acquire and convert the temperature of the laser device into the measurement voltage.

11. The laser measurement device according to claim 7, wherein the laser device comprises at least one laser diode.

12. The laser measurement device according to claim 7, wherein the laser measurement device includes a laser leveling device, a laser line projection device, a laser spot projection device, or a laser distance meter.

13. A control method for controlling a temperature of a laser device, comprising:
   generating a pulse width modulation (PWM) signal;
   acquiring and converting the temperature of the laser device into a measurement voltage;
   comparing, by a voltage comparator, the acquired measurement voltage associated with the temperature of the laser device with a temperature threshold voltage, and outputting a comparison result signal;
   generating, by a logic circuit, a drive signal based on the PWM signal and the comparison result signal to drive the laser device; and
   inverting, by the logic circuit, the PWM signal to reduce a power for driving the laser device, when the measurement voltage associated with the temperature of the laser device is higher than the temperature threshold voltage.

14. The control method according to claim 13, wherein the duty ratio of the PWM signal is not less than 5:5.

15. The control method according to claim 13, wherein the logic circuit includes an exclusive-OR (XOR) gate circuit.

16. The control method according to claim 13, wherein:
   the temperature acquisition circuit includes a temperature sensor; and
   acquiring the temperature of the laser device further includes: acquiring the temperature of the laser device by the temperature sensor.

17. The control method according to claim 13, wherein the laser device comprises at least one laser diode.

* * * * *